US009035427B2

(12) United States Patent
Kim et al.

(10) Patent No.: US 9,035,427 B2
(45) Date of Patent: May 19, 2015

(54) METAL-SEMICONDUCTOR CONVERGENCE ELECTRIC CIRCUIT DEVICES AND ELECTRIC CIRCUIT SYSTEMS USING THE SAME

(75) Inventors: Hyun-Tak Kim, Daejeon (KR); Bongjun Kim, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 348 days.

(21) Appl. No.: 13/703,886

(22) PCT Filed: Jul. 1, 2011

(86) PCT No.: PCT/KR2011/004838
§ 371 (c)(1),
(2), (4) Date: Dec. 14, 2012

(87) PCT Pub. No.: WO2012/002764
PCT Pub. Date: Jan. 5, 2012

(65) Prior Publication Data
US 2013/0087786 A1    Apr. 11, 2013

(30) Foreign Application Priority Data

Jul. 1, 2010    (KR) .................. 10-2010-0063500
Dec. 15, 2010    (KR) .................. 10-2010-0128380

(51) Int. Cl.
*H01L 29/66*    (2006.01)
*H01L 49/02*    (2006.01)
*H01L 27/06*    (2006.01)
*H01L 25/16*    (2006.01)
*H01L 27/08*    (2006.01)

(52) U.S. Cl.
CPC ............. *H01L 28/24* (2013.01); *H01L 27/0629* (2013.01); *H01L 25/167* (2013.01); *H01L 2924/01013* (2013.01); *H01L 2924/01028* (2013.01); *H01L 27/0802* (2013.01); *H01L 2224/45147* (2013.01); *H01L 2924/01047* (2013.01); *H01L 2924/00014* (2013.01)

(58) Field of Classification Search
CPC ........................................................ H01L 28/24
USPC ........................................................ 257/577
See application file for complete search history.

(56) References Cited

FOREIGN PATENT DOCUMENTS

| JP | 05-243508 A | 9/1993 |
| JP | 09-129818 A | 5/1997 |
| JP | 09129818 A * | 5/1997 |

(Continued)

OTHER PUBLICATIONS

International Search Report for PCT/KR2011/004838 filed on Jul. 1, 2011.
Kim, Hyun-Tak et al., "Mechanism and observation of Mott transition in VO2-based two-and three-terminal devices", New Journal of Physics, May 17, 2004, pp. 1-19, vol. 6, Issue 52.

(Continued)

*Primary Examiner* — Michael Lebentritt
*Assistant Examiner* — Aaron Dehne (57) ABSTRACT

Provided are metal-semiconductor convergence electric circuit devices. The device includes a semiconductor device, a metal resistor exhibiting resistance increased with an increase in temperature thereof, and an interconnection line connecting the semiconductor device with the metal resistor in series and having a resistance lower than that of the metal resistor. The semiconductor device is configured to exhibit resistance decreased with an increase in temperature thereof and compensate the resistance increase of the metal resistor.

14 Claims, 5 Drawing Sheets

(56) References Cited

FOREIGN PATENT DOCUMENTS

JP    2001-024199  A    1/2001
KR    20-0432142  Y1    11/2006

OTHER PUBLICATIONS

M.M. Qazilbash et al., "Correlated metallic state of vanadium dioxide", Physical Review B, Nov. 22, 2006, pp. 1-5. vol. 74, Issue 205118.

* cited by examiner

| Power | 3.4V | | 3.6V | |
|---|---|---|---|---|
| | Current$_{MAX}$(A) | LED Temperature of heat dissipating plate | Current$_{MAX}$(A) | LED Temperature of heat dissipating plate |
| | 0.695 | 88°C | 0.914 | 111°C |
| | 0.84 | Start to be burned | — | — |

Fig. 12 though that of the metal resistor, and an interconnection line connecting the semiconductor device with the metal resistor in series, the interconnection line having a resistance lower than that of the metal resistor. The metal resistor may have resistance of about 0.2Ω to about 10Ω, and the semiconductor device may exhibit resistance decreased with an increase in temperature thereof to compensate the resistance increase of the metal resistor.

METAL-SEMICONDUCTOR CONVERGENCE ELECTRIC CIRCUIT DEVICES AND ELECTRIC CIRCUIT SYSTEMS USING THE SAME

TECHNICAL FIELD

Embodiments of the inventive concepts relate to a metal-semiconductor convergence electric circuit device and an electric circuit system using the same.

BACKGROUND ART

Figure 1:
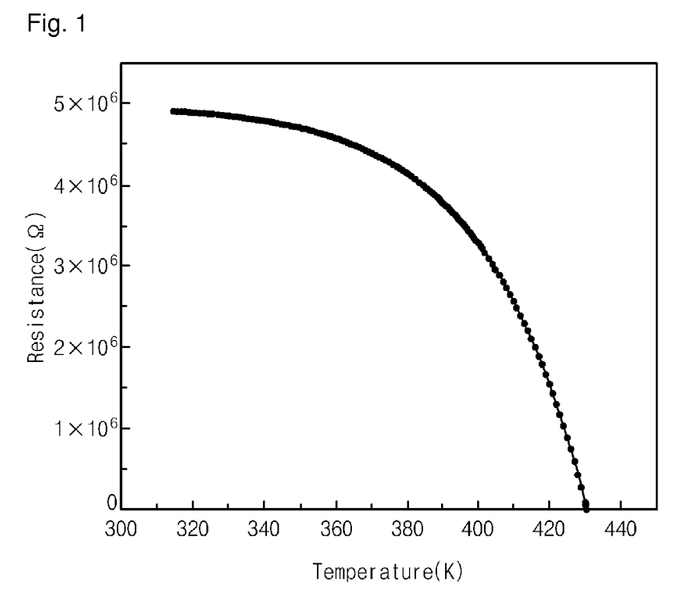
FIG. 1 shows resistance of a typical semiconductor device at different temperatures.

Generally, an impurity semiconductor device or a pn-junction semiconductor device exhibits electric resistance exponentially decreased with increasing temperature, as shown in FIG. 1. A semiconductor device may undergo Joule heating when an electric current flows. This Joule heating reduces electric resistance of the semiconductor device, thereby increasing the electric current passing through the semiconductor device. This results in generating more heat from the semiconductor device. Occasionally, Joule heat generated by this heating mechanism may be large enough to cause serious damage on the semiconductor device. This phenomenon is called "Thermal Runaway". The thermal runaway has caused difficulty in connecting the semiconductor devices in parallel.

DISCLOSURE OF INVENTION

Technical Problem

Embodiments of the inventive concepts provide a metal-semiconductor convergence electric circuit device configured to prevent a semiconductor device therein from being damaged by the thermal runaway.

Other embodiments of the inventive concepts provide an electric circuit system configured to prevent a semiconductor device therein from being damaged by the thermal runaway.

Solution to Problem

According to example embodiments of the inventive concepts, a metal-semiconductor convergence electric circuit device may be provided. The device may include a semiconductor device, a metal resistor disposed adjacent to the semiconductor device, the metal resistor exhibiting resistance increased with an increase in temperature thereof, and an interconnection line connecting the semiconductor device with the metal resistor in series, the interconnection line having a resistance lower than that of the metal resistor. The metal resistor may have resistance of about 0.2Ω to about 10Ω, and the semiconductor device may exhibit resistance decreased with an increase in temperature thereof to compensate the resistance increase of the metal resistor.

In some embodiments, the metal resistor may have resistance of about 0.5Ω to about 1Ω.

In some embodiments, the metal resistor may have resistance of about 0.5 to about 1.

In some embodiments, the metal resistor may be a metal oxide transition device.

In some embodiments, the semiconductor device comprises at least one of an impurity semiconductor, a pn-junction diode, a pn-junction light-emitting diode, a bipolar junction transistor, or a field-effect transistor.

According to other example embodiments of the inventive concepts, an electric circuit system including a plurality of electric circuit devices connected to each other in series or in parallel is provided. In some embodiments, at least one of the electric circuit devices may be the afore-described metal-semiconductor convergence electric circuit device.

Advantageous Effects of Invention

According to example embodiments of the inventive concepts, it is possible to prevent a semiconductor device from being damaged by the thermal runaway, even if a power without a constant-current supplying function is used to operate a metal-semiconductor convergence electric circuit device and an electric circuit system.

According to example embodiments of the inventive concepts, heat generated form a semiconductor device may be used to effectively prevent the semiconductor device undergoing the thermal runaway. Even in the case of the absence of a constant-current circuit, it is possible to reduce a variation in an electric current passing through the semiconductor device. Furthermore, an electric circuit device and an electric circuit system can be configured without any heat-dissipating element for cooling the semiconductor device or with a miniaturized heat-dissipating element.

BEST MODE FOR CARRYING OUT THE INVENTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term and/or includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "including" and/or "including", if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, the term 'resistance' may refer to an electric resistance.

Figure 2:
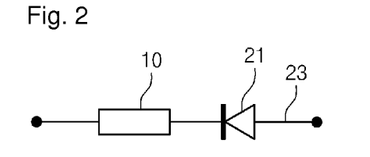
FIG. 2 is a circuit diagram of a metal-semiconductor convergence electric circuit device according to example embodiments of the inventive concepts.

FIG. 2 is a circuit diagram of a metal-semiconductor convergence electric circuit device according to example embodiments of the inventive concepts.

Referring to FIG. 2, a metal-semiconductor convergence electric circuit device may include a semiconductor device 21, a metal resistor 10, and an interconnection line 23 connecting the semiconductor device 21 with the metal resistor 10 in series.

The semiconductor device 21 may be at least one of an impurity semiconductor, a pn-junction diode, a pn-junction light-emitting diode, a bipolar junction transistor, or a field-effect transistor.

The metal resistor 10 may be disposed adjacent to the semiconductor device and be configured to exhibit an increase in resistance when subjected to an increase in temperature of the semiconductor device 21. In some embodiments, the metal resistor 10 may be configured to have resistance linearly increasing with the temperature of the semiconductor device 21. The interconnection line 23 may be configured to have a resistance lower than that of the metal resistor 10. The resistance of the interconnection line 23 may be considerably low, for instance, in a range of about $0.01\Omega$ to about $0.1\Omega$, enough to reduce an electric resistance of the electric circuit.

The semiconductor device 21 may be configured in such a way that internal resistance thereof decreases with an increase in heat generated in the semiconductor device 21. This internal resistance reduction may result in an increase of electric current passing through the semiconductor device 21. Meanwhile, since the resistance of the metal resistor 10 increases with an increase in temperature, heat generated from the semiconductor device 21 may increase the resistance of the metal resistor 10 and decrease the electric current passing through the semiconductor device 21. An increase of an electric current caused by the internal resistance reduction of the semiconductor device 21 may compensate a decrease of an electric current caused by the resistance increase of the metal resistor 10. This enables to reduce a variation in an electric current passing through the semiconductor device 21.

The metal resistor 10 may be at least one of a metal wire or a metal oxide transition device. The metal wire may include at least one of silver, copper, gold, aluminum, calcium, tungsten, zinc, nickel, iron, platinum, tin, lead, indium, manganese, cobalt, molybdenum, titanium, vanadium, chromium, barium, lanthanum, cerium, TiNi, TiW, NiV, or any combination thereof. In some embodiments, a temperature coefficient a of the metal wire may be given by $a=(1/r)(dr/dT)$, where r is a resistivity coefficient and T the absolute temperature, and may be in a range of 0.004 or less. The metal oxide transition device may include a metal oxide layer having a metal-insulator transition (MIT) property and exhibiting a high electron-electron correlation. For instance, the metal oxide transition device may include at least one of $VO_2$, W-doped $VO_2$, Mn-doped $VO_2$, Cr-doped $VO_2$, $V_2O_3$, $MnO_2$, $CrO_2$, $TiO_2$, ZnO, $YBa_2Cu_3O_7$, n-type $BaTiO_3$, $Sr_{1-x}La_xTiO_3$ ($0.01<x<0.5$), ITO, $La_{1-x}Sr_{x2}CuO_4$ ($0.01<x<0.5$), $CuO_2$, $InO_2$, NiO, CeO, RuO, or iron oxide. The metal oxide transition device in a metal state may have a considerably high temperature coefficient, compared with a typical metal. For example, a temperature coefficient of metallized vanadium dioxide, a typical MIT material, is about 1.1.

Figure 3:
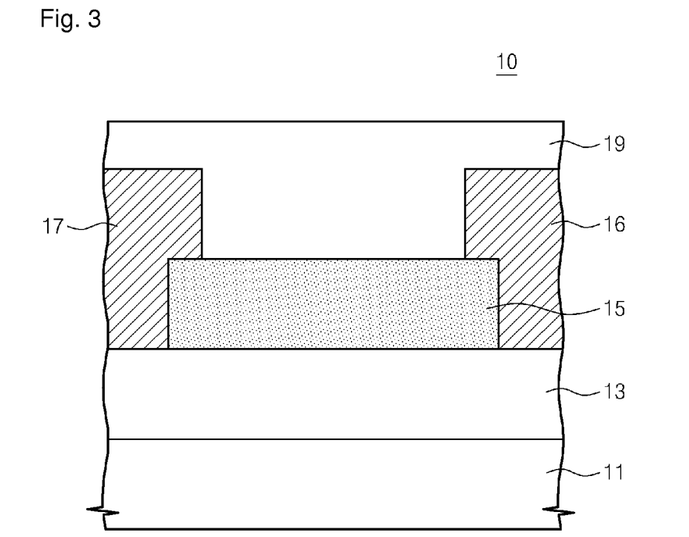
FIG. 3 is a sectional view of the metal resistor of FIG. 2 according to example embodiments of the inventive concepts.

FIG. 3 is a sectional view of the metal resistor of FIG. 2 according to example embodiments of the inventive concepts. Referring to FIG. 3, the metal resistor 10 may include a metal resistor layer 15 provided on a substrate 11 to exhibit a temperature dependent resistance property, first and second electrodes 16 and 17 spaced apart from each other and connected to opposite portions of the metal resistor layer 15, and a protection insulating layer 19 covering the metal resistor layer 15 and the first and second electrodes 16 and 17. A buffer insulating layer 13 may be interposed between the substrate 11 and the metal resistor layer 15. The metal resistor layer 15 may be used to realize the afore-described typical metal wire and/or the metal oxide transition device, and exhibit resistance increased with increasing temperature.

Figure 4:
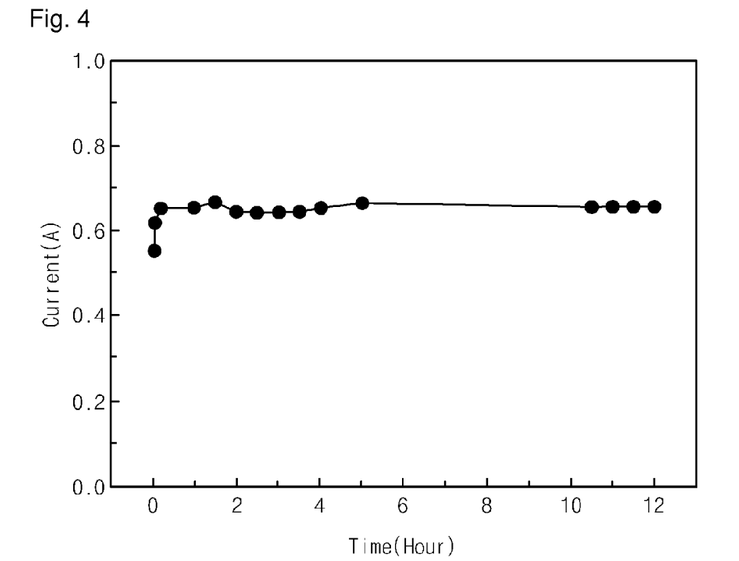
FIGS. 4 and 5 are graphs illustrating relationships of electric current and temperature to time.
Figure 5:
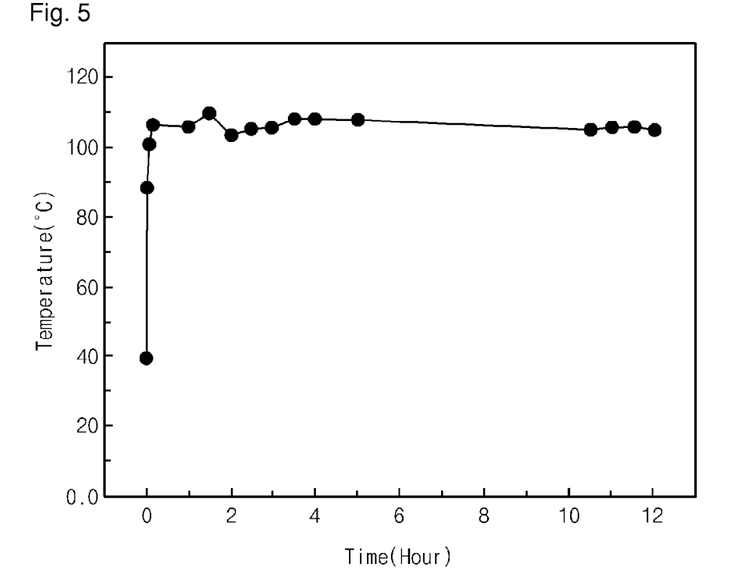

FIGS. 4 and 5 are graphs illustrating relationships of electric current and temperature to time. In detail, FIGS. 4 and 5 were obtained from a metal-semiconductor convergence electric circuit device forming the circuit diagram of FIG. 2. In the metal-semiconductor convergence electric circuit device, a light-emitting diode was used as the semiconductor device, the metal resistor had resistance of 2, and the metal wire was a tin-plated copper wire.

Referring to FIGS. 4 and 5, a ripple phenomenon occurred during initial stage. In more detail, during the initial stage, there was an increase in an electric current passing through the semiconductor device 21, as shown in FIG. 4, and there was an increase in temperature of the light-emitting diode, as shown in FIG. 5. Thereafter, as shown in FIGS. 4 and 5, the electric current and the temperature remained substantially constant for approximately twelve hours. Given that a constant-current power device was not used in the experiment, it can be said that the constancy in electric current and temperature result from the presence of the metal resistor. In other words, the metal resistor according to example embodiments of the inventive concepts can prevent the thermal runaway from occurring while operating the electric circuit device and enables to realize stability in electric current and temperature.

Figure 6:
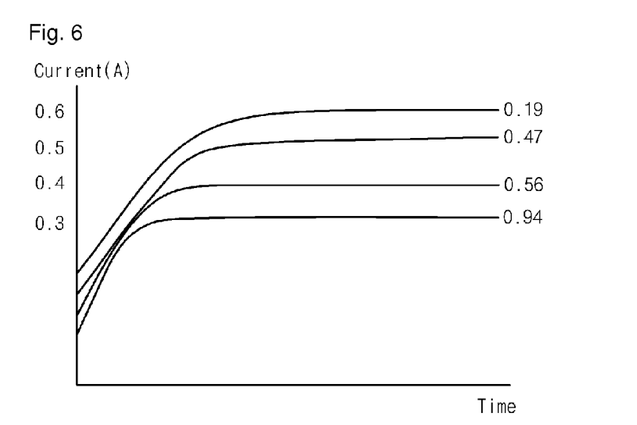
FIG. 6 is a graph illustrating a relationship between an electric current passing through a semiconductor device and resistance of a metal resistor.

FIG. 6 is a graph illustrating a temporal relationship between an electric current passing through the semiconductor device 21 and resistance of the metal resistor 10. The experiment was executed under a fixed power voltage of 3.5 V. A tin-plated copper wire was used as the metal resistor 10. The following Table 1 summarizes the experiment of FIG. 6.

TABLE 1

| Resistance of resistor (Ω) | Initial current (A) | Maximum current (A) | Time spent in arriving at the maximum current (min) | Mean current (A) |
|---|---|---|---|---|
| 0.19 | 0.38 | 0.661 | 6 | 0.620 |
| 0.47 | 0.33 | 0.548 | 4 | 0.546 |
| 0.56 | 0.31 | 0.456 | 3 | 0.455 |
| 0.94 | 0.27 | 0.336 | 2 | 0.333 |

Time spent in arriving at the maximum electric current decreased as the resistance of the metal resistor 10 increased. In the case that the resistance of the metal resistor 10 was low (for example, less than 0.2Ω), a difference between the initial and maximum currents increased and it took quite a long time to arrive at a mean current. By contrast, in the case that the resistance of the metal resistor 10 was high (for example, more than 1Ω), it was advantageous that time taken to arrive at the maximum current was shortened, but the electric current was disadvantageously reduced.

In some embodiments, the metal resistor 10 may have resistance of about 0.1Ω to about 5Ω. In other embodiments, the metal resistor 10 may have resistance of about 0.5Ω to about 1Ω.

Figure 7:
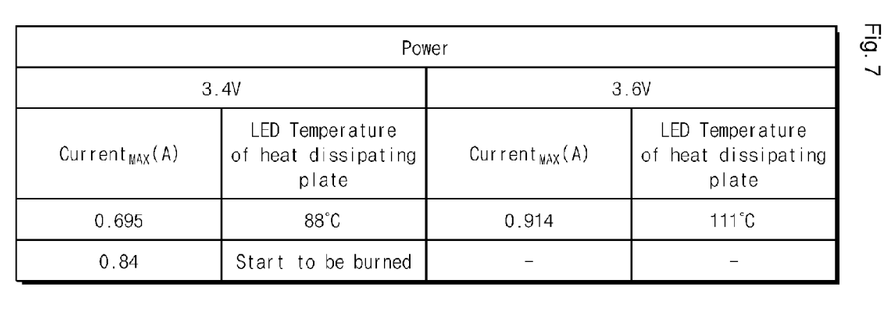
FIG. 7 is a table summarizing technical features of the metal-semiconductor convergence electric circuit device configured like the circuit diagram of FIG. 2, according to the presence or absence of the metal resistor.

FIG. 7 is a table summarizing technical features of the metal-semiconductor convergence electric circuit device configured like the circuit diagram of FIG. 2, according to the presence or absence of the metal resistor. In the experiment, a light-emitting diode was used for the semiconductor device 21, and a tin-plated iron having resistance of 0.54Ω was used for the metal resistor 10. The semiconductor device 21 and the metal resistor 10 was, in series, connected by an interconnection line 23 of, for example, gold. A heat dissipating plate of the light-emitting diode was configured to adhere closely to the metal resistor so as to effectively deliver heat generated from the light-emitting diode to the metal resistor.

To begin with, it will be described below for the case of the presence of the metal resistor 10. For an applied voltage of 3.4V, as shown in FIGS. 4 and 5, the maximum current flowing through the light-emitting diode was 0.695 A and there occurred a ripple phenomenon. (I=0.685 A 0.005 A.) Within one to three minutes, the electric current was stabilized near 0.685 A. The heat dissipating plate of the light-emitting diode was heated to a temperature of 88° C. For an applied voltage of 3.6V, the electric current increased to the maximum current of 0.914 A in short time and then was stabilized. In this case, the heat dissipating plate of the light-emitting diode was heated to a temperature of 111° C.

Next, it will be described below for the case of the absence of the metal resistor 10. For an applied voltage of 3.4V, there occurred the thermal runaway. In detail, the electric current increased over 0.84 A and finally, the light-emitting diode was burned. For an applied voltage of 3.6V, there was an excessive thermal runaway and the light-emitting diode was burn at the beginning of the experiment.

MODE FOR THE INVENTION

Figure 8:
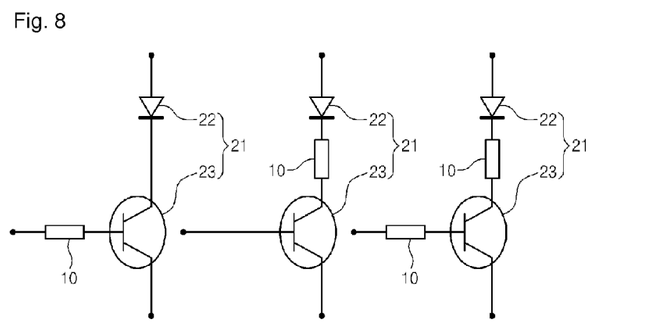
FIG. 8 is a circuit diagram of a metal-semiconductor convergence electric circuit device according to other example embodiments of the inventive concepts.

FIG. 8 is a circuit diagram of a metal-semiconductor convergence electric circuit device according to other example embodiments of the inventive concepts. The device of FIG. 8 may be configured to have the same technical features as that described with reference to FIG. 2, except for difference to be described below. Referring to FIG. 8, the metal-semiconductor convergence electric circuit device may include the metal resistor 10 connected to at least one of the base, collector or emitter of the bipolar junction transistor 23. The semiconductor devices 21 include a pn-junction diode 22 and the bipolar junction transistor 23.

Figure 9:
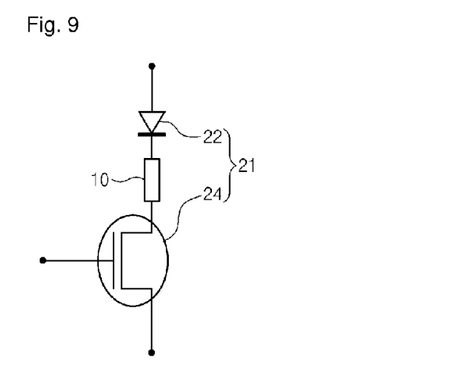
FIG. 9 is a circuit diagram of a metal-semiconductor convergence electric circuit device according to still other example embodiments of the inventive concepts.

FIG. 9 is a circuit diagram of a metal-semiconductor convergence electric circuit device according to still other example embodiments of the inventive concepts. The device of FIG. 9 may be configured to have the same technical features as that described with reference to FIG. 2, except for difference to be described below. Referring to FIG. 9, the metal-semiconductor convergence electric circuit device may include the metal resistor 10 connected to at least one of the source or drain of the field-effect transistor 24. The semiconductor devices 21 include the pn-junction diode 22 and the field-effect transistor 23.

Figure 10:
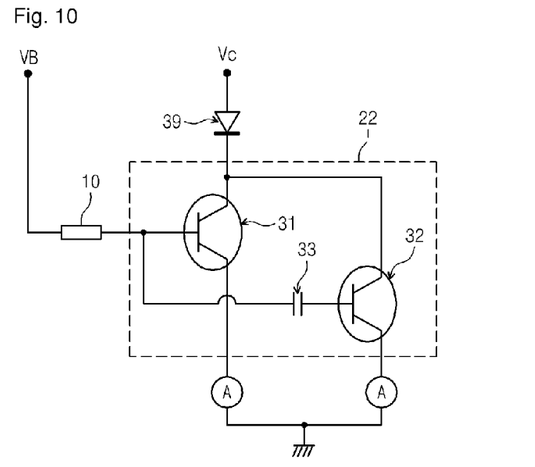
FIG. 10 is a circuit diagram of a metal-semiconductor convergence electric circuit device according to even other example embodiments of the inventive concepts.

FIG. 10 is a circuit diagram of a metal-semiconductor convergence electric circuit device according to even other example embodiments of the inventive concepts. The electric circuit device of FIG. 10 may be configured to have the technical features described with reference to FIG. 2. Referring to FIG. 10, a semiconductor device 22 of the metal-semiconductor convergence electric circuit device may include a first bipolar transistor 31 and a second bipolar transistor 32. Here, a base of the first bipolar transistor 31 may be connected to a base of the second bipolar transistor 32 via a resistor 33. Emitters of the first and second bipolar transistors 31 and 32 may be connected to each other and be grounded.

The metal resistor 10 (e.g., PTC device) may be additionally connected to the base of the first bipolar transistor 31. The light-emitting diode 39 may be additionally connected to the collector of the first bipolar transistor 31.

In some embodiments, the semiconductor device, the metal resistor, and the interconnection line may be provided in one package to form a single body structure.

Figure 11:
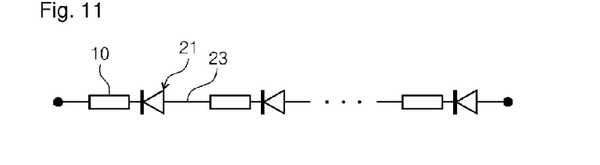
FIG. 11 is a circuit diagram of an electric circuit system according to example embodiments of the inventive concepts.

FIG. 11 is a circuit diagram of an electric circuit system according to example embodiments of the inventive concepts. The electric circuit device of FIG. 11 may be configured to have the technical features described with reference to FIG. 2. The electric circuit system may be, for example, a light-emitting device.

Referring to FIG. 11, the electric circuit system may include semiconductor devices 21 connected to each other in series. In some embodiments, the semiconductor devices 21 may be light-emitting diodes. The electric circuit system may include metal resistors 10 provided between the semiconductor devices 21 and interconnection lines 23 connecting the semiconductor devices 21 with the metal resistors 10. The metal resistors 10 may be configured to exhibit an increase in resistance when subjected to an increase in temperature of the semiconductor device 21, and the interconnection lines 23 may be configured to have a resistance lower than that of the metal resistors 10. In some embodiments, the metal resistors 10 may have resistance of about $0.2\Omega$ to about $10\Omega$. The resistance of the semiconductor devices 21 may decrease during temperature increase, while the resistance of the metal resistors 10 increases at the same time. As a result, the resistance reduction of the semiconductor device 21 may be compensated by the resistance increase of the metal resistor 10.

Figure 12:
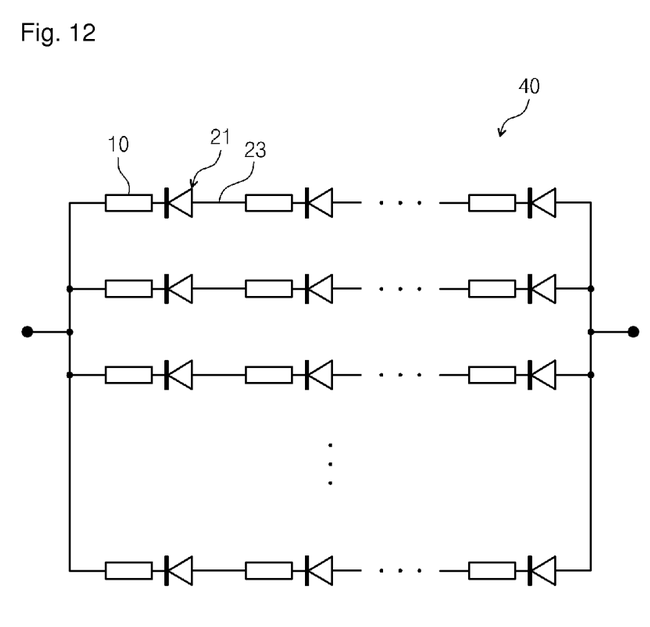
FIG. 12 is a circuit diagram of an electric circuit system according to other example embodiments of the inventive concepts.

FIG. 12 is a circuit diagram of an electric circuit system according to other example embodiments of the inventive concepts. The electric circuit device of FIG. 12 may be configured to have the technical features described with reference to FIG. 2. The electric circuit system may be, for example, a light-emitting device.

Referring to FIG. 12, the electric circuit system 40 may include circuits 30 having semiconductor devices 21 connected to each other in series. In some embodiments, the semiconductor devices 21 may be light-emitting diodes. The circuits 30 may be connected to each other in parallel. Each of the circuits 30 may include metal resistors 10 provided between the semiconductor devices 21 connected to each other in series and interconnection lines 23 connecting the semiconductor devices 21 with the metal resistors 10. The metal resistors 10 may be configured to exhibit an increase in resistance when subjected to an increase in temperature of the semiconductor device 21, and the interconnection lines 23 may be configured to have a resistance lower than that of the metal resistors 10. In some embodiments, the metal resistors 10 may have resistance of about $0.2\Omega$ to about $10\Omega$. The semiconductor devices 21 may be configured to exhibit resistance decreased with increasing temperature, while the metal resistors 10 may be configured to exhibit resistance increased with increasing temperature. As a result, the resistance reduction of the semiconductor device 21 may be compensated by the resistance increase of the metal resistor 10.

In some embodiments, an electric circuit system may include a plurality of electric circuits, some of which may be connected to each other in parallel and the rest of which may be connected to each other in series. Here, each of the electric circuits may be configured as that of FIG. 2.

While example embodiments of the inventive concepts have been particularly shown and described, it will be understood by one of ordinary skill in the art that variations in form and detail may be made therein without departing from the spirit and scope of the attached claims.

The invention claimed is:

1. A metal-semiconductor convergence electric circuit device, comprising:
    a semiconductor device;
    a metal resistor disposed adjacent to the semiconductor device, the metal resistor exhibiting resistance increased with an increase in temperature thereof; and
    an interconnection line connecting the semiconductor device with the metal resistor in series, the interconnection line having a resistance lower than that of the metal resistor, wherein the metal resistor has resistance of about $0.2\Omega$ to about $10\Omega$, and the semiconductor device exhibits resistance decreased with an increase in temperature thereof to compensate the resistance increase of the metal resistor,
    wherein the semiconductor device comprises a first bipolar transistor and a second bipolar transistor, and the base of the first bipolar transistor is connected to the base of the second bipolar transistor via the metal resistor, and the emitters of the first and second bipolar transistors are connected to each other.

2. The device of claim 1, wherein the metal resistor has resistance of about $0.5\Omega$ to about $1\Omega$.

3. The device of claim 1, wherein the metal resistor is a metal oxide transition device or a metal wire.

4. The device of claim 3, wherein the metal oxide transition device comprises at least one of $VO_2$, W-doped $VO_2$, Mn-doped $VO_2$, Cr-doped $VO_2$, $V_2O_3$, $MnO_2$, $CrO_2$, $TiO_2$, ZnO, $YBa_2Cu_3O_7$, n-type $BaTiO_3$, $Sr_{1-x}La_xTiO_3$ ($0.01<x<0.5$), ITO, $La_{1-x}Sr_{x2}CuO_4$ ($0.01<x<0.5$), $CuO_2$, $InO_2$, NiO, CeO, RuO, or iron oxide.

5. The device of claim 3, wherein the metal wire comprises at least one of silver, copper, gold, aluminum, calcium, tungsten, zinc, nickel, iron, platinum, tin, lead, indium, manganese, cobalt, molybdenum, titanium, vanadium, chromium, barium, lanthanum, cerium, TiNi, TiW, NiV, or any combination thereof.

6. The device of claim 1, wherein the semiconductor device comprises at least one of an impurity semiconductor, a pn-junction diode, a pn-junction light-emitting diode, a bipolar junction transistor, or a field-effect transistor.

7. The device of claim 6, wherein the metal resistor is connected to at least one of the base, collector or emitter of the bipolar junction transistor.

8. The device of claim 6, wherein the metal resistor is connected to at least one of the source or drain of the field-effect transistor.

9. The device of claim 1, further comprising a light-emitting diode connected to the collector of the first bipolar transistor.

10. The device of claim 1, wherein the emitters of the first and second bipolar transistors are grounded.

11. The device of claim 1, wherein the semiconductor device, the metal resistor, and the interconnection line are provided in one package to form a single body structure.

12. The device of claim 1, wherein the metal resistor comprises:
- a metal resistor layer disposed on a substrate to exhibit a temperature dependent resistance property;
- first and second electrodes spaced apart from each other and connected to different portions of the metal resistor layer; and
- an insulating layer covering the metal resistor layer and the first and second electrodes.

13. An electric circuit system comprising a plurality of electric circuit devices connected to each other in series or in parallel, wherein at least one of the electric circuit devices is the metal-semiconductor convergence electric circuit device of the claim 1.

14. The system of claim 13, wherein the semiconductor device included in the metal-semiconductor convergence electric circuit device of the claim 1 is a light-emitting diode.

* * * * *